United States Patent
Hsieh et al.

(10) Patent No.: US 12,457,812 B2
(45) Date of Patent: Oct. 28, 2025

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Feng-Chien Hsieh, Pingtung County (TW); Yun-Wei Cheng, Taipei (TW); Wei-Li Hu, Tainan (TW); Kuo-Cheng Lee, Tainan (TW); Cheng-Ming Wu, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 539 days.

(21) Appl. No.: 17/818,344

(22) Filed: Aug. 8, 2022

(65) Prior Publication Data
US 2024/0047487 A1    Feb. 8, 2024

(51) Int. Cl.
*H10F 39/00*    (2025.01)
*H10F 39/18*    (2025.01)
*H10F 39/12*    (2025.01)

(52) U.S. Cl.
CPC ....... *H10F 39/8023* (2025.01); *H10F 39/014* (2025.01); *H10F 39/028* (2025.01); *H10F 39/8027* (2025.01); *H10F 39/8033* (2025.01); *H10F 39/807* (2025.01); *H10F 39/813* (2025.01); *H10F 39/182* (2025.01); *H10F 39/199* (2025.01); *H10F 39/8053* (2025.01)

(58) Field of Classification Search
CPC .. H10F 39/8023; H10F 39/014; H10F 39/028; H10F 39/8027; H10F 39/8033; H10F 39/807; H10F 39/813; H10F 39/182; H10F 39/199; H10F 39/8053; H10F 39/8037; H10F 39/80373; H10F 39/8063
See application file for complete search history.

(56) References Cited

U.S. PATENT DOCUMENTS

2018/0114806 A1\*  4/2018  Kim .................... H10F 39/8063
2019/0103428 A1\*  4/2019  Wei ........................ H10F 39/813

\* cited by examiner

*Primary Examiner* — Patricia D Valenzuela
(74) *Attorney, Agent, or Firm* — WPAT LAW; Anthony King

(57) ABSTRACT

An image sensor device includes a semiconductor substrate having a first side, and a trench isolation structure dividing the substrate into sensing units. Each sensing unit includes a first gate electrode and a second gate electrode disposed on the first side, and a first pixel and a second pixel extending into the substrate and disposed between the first and second gate electrodes from a top view perspective. The first pixel is disposed under the second pixel and electrically connected to the first gate electrode, and the second pixel is electrically connected to the second gate electrode. A method of manufacturing a semiconductor structure includes forming a trench isolation in a semiconductor substrate; forming a first pixel in the substrate; forming a second pixel in the substrate over the first pixel; forming a first gate structure over the substrate; and forming a second gate structure over the second pixel.

20 Claims, 16 Drawing Sheets

SEMICONDUCTOR STRUCTURE AND METHOD OF MANUFACTURING THE SAME

BACKGROUND

Semiconductor image sensors are used to sense electromagnetic radiation such as visible light, infrared radiation, and/or ultraviolet light. Complementary metal-oxide-semiconductor (CMOS) image sensors (CIS) and charge-coupled device (CCD) sensors are used in various applications such as digital cameras or incorporated cameras in mobile devices. These devices utilize an array of pixels (which may include photodiodes and transistors) to detect radiation using photogeneration of electron-hole pairs.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
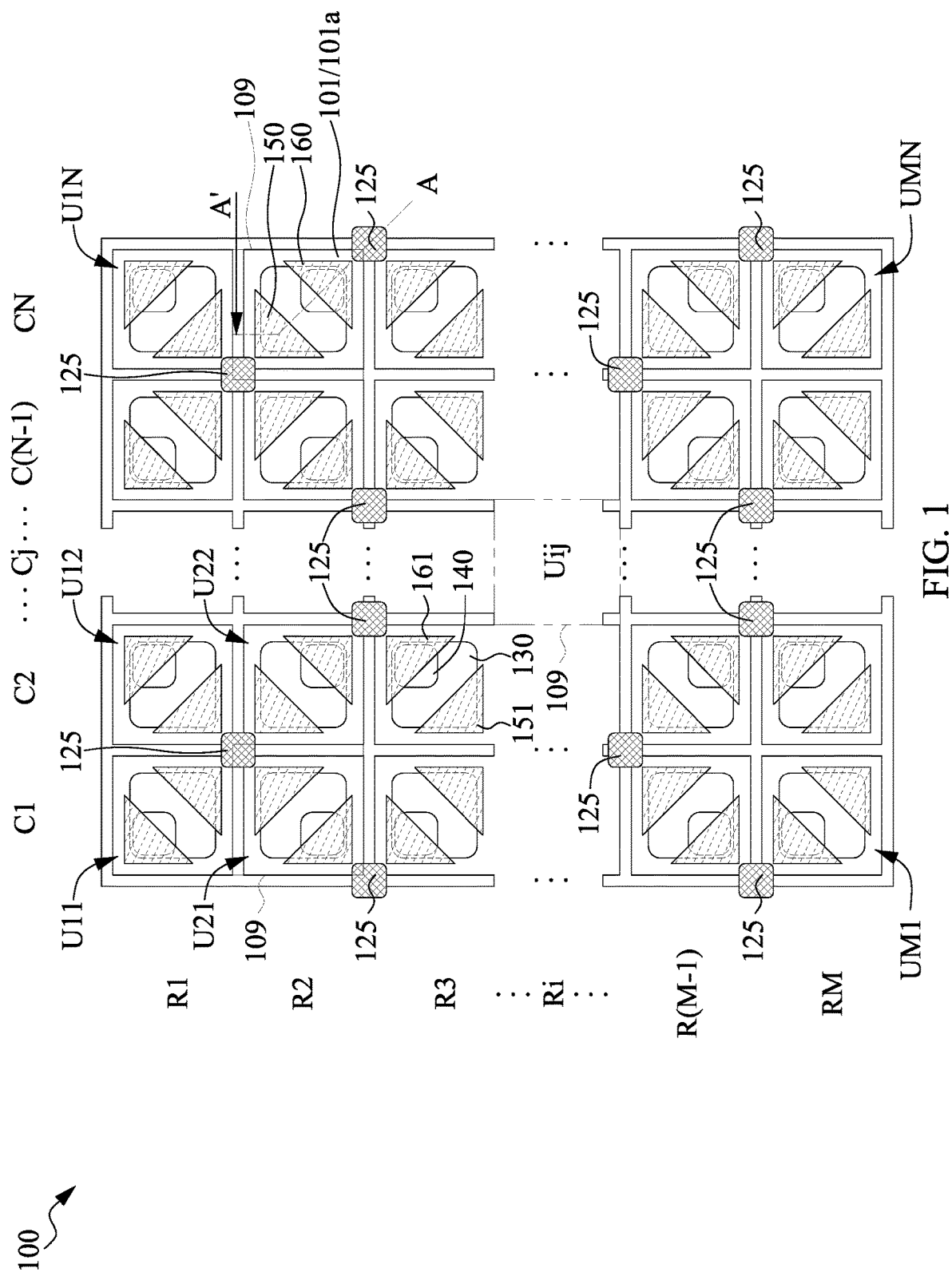
FIG. 1 is a schematic top view of a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. In addition, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The semiconductor integrated circuit (IC) industry has experienced rapid growth. Technological advances in IC materials and design have produced generations of ICs where each generation has smaller and more complex circuits than the previous generation. Among other applications, semiconductor ICs may be used to implement image sensors to sense radiation such as light. For example, complementary metal-oxide-semiconductor (CMOS) image sensors (CIS) and charge-coupled device (CCD) sensors are widely used in various applications.

CMOS image sensors generally are pixelated metal oxide semiconductors. A CMOS image sensor typically utilizes an array of pixels (which may include photodiodes and transistors) in a substrate to absorb (i.e., sense) radiation that is projected toward the substrate and convert the sensed radiation into electrical signals, and each pixel may include transistors, capacitors, and a photo-sensitive element. A CMOS image sensor utilizes light-sensitive CMOS circuitry to convert photons into electrons. The light-sensitive CMOS circuitry typically comprises a photo diode formed in a substrate. As the photo diode is exposed to light, an electrical charge is induced in the photo diode. Each pixel may generate electrons proportional to the amount of light that falls on the pixel when light is incident on the pixel from a subject scene. Furthermore, the electrons are converted into a voltage signal in the pixel and are further transformed into a digital signal by means of an A/D converter. A plurality of periphery circuits may receive the digital signals and process them to display an image of the subject scene.

A CMOS image sensor may comprise a plurality of additional layers, such as dielectric layers and interconnect metal layers, formed on top of the substrate, wherein the interconnect layers are used to couple the photo diode to the peripheral circuitry. The side having additional layers of the CMOS image sensor is commonly referred to as a front side, while the side having the substrate is referred to as a backside. Depending on the light path difference, CMOS image sensors can be further divided into two major categories, namely front side illuminated (FSI) image sensors and backside illuminated (BSI) image sensors.

However, conventional semiconductor image sensor devices may still have various shortcomings. For example, image sensor devices have pixels that are selectively turned on and off for repeating cycles, where the pixels are configured to collect light when they are turned on but not when they are turned off. While this type of operation is fine in most situations, it may present a problem with respect to light sources that also have a pulsing nature. For example, a light-emitting diode (LED) device may have "on" and "off" periods within each pulse cycle. The LED device may emit light during the "on" period but does not emit light during the "off" period. As such, if the pulse frequency of the image sensor device is not synchronized with the pulse frequency of the LED device, the image sensor device may capture "flickering" images of the LED device. In other words, the light from the LED appears as though it is "flickering" to the image sensor device, even though the human eye may still observe a steady or continuously turned-on LED. When the flickering effect is produced, it is not only visually displeasing but could also be dangerous, for example in automotive applications where image sensors are used to monitor a vehicle's surroundings, such as traffic signals or other signs that use LED light sources. Further, some image sensor devices include a metal grid configured to define pixels. The metal grid may block light and makes the pixels difficult to control.

Therefore, while existing semiconductor image sensors have been generally adequate for their intended purposes, they have not been entirely satisfactory in every aspect.

In the present disclosure, a semiconductor structure, an image sensor device, and a method of manufacturing a semiconductor structure are provided. In particular, a semiconductor structure including a semiconductor substrate, a trench isolation extending into the semiconductor substrate, a first gate electrode, a second gate electrode, a first pixel disposed in the semiconductor substrate and adjacent to the trench isolation and a second pixel disposed in the semiconductor substrate and overlapping the first pixel from a top view perspective is disclosed below. An image sensor device including a semiconductor substrate, wherein a trench isolation structure divides the semiconductor substrate into a plurality of sensing units and each sensing unit includes the aforementioned semiconductor structure is also disclosed below. Other features and processes are also included in some embodiments. The semiconductor structure includes the second pixel disposed in the semiconductor substrate and overlapping the first pixel from the top view perspective, in order to improve performance of the image sensor device.

Figure 2:
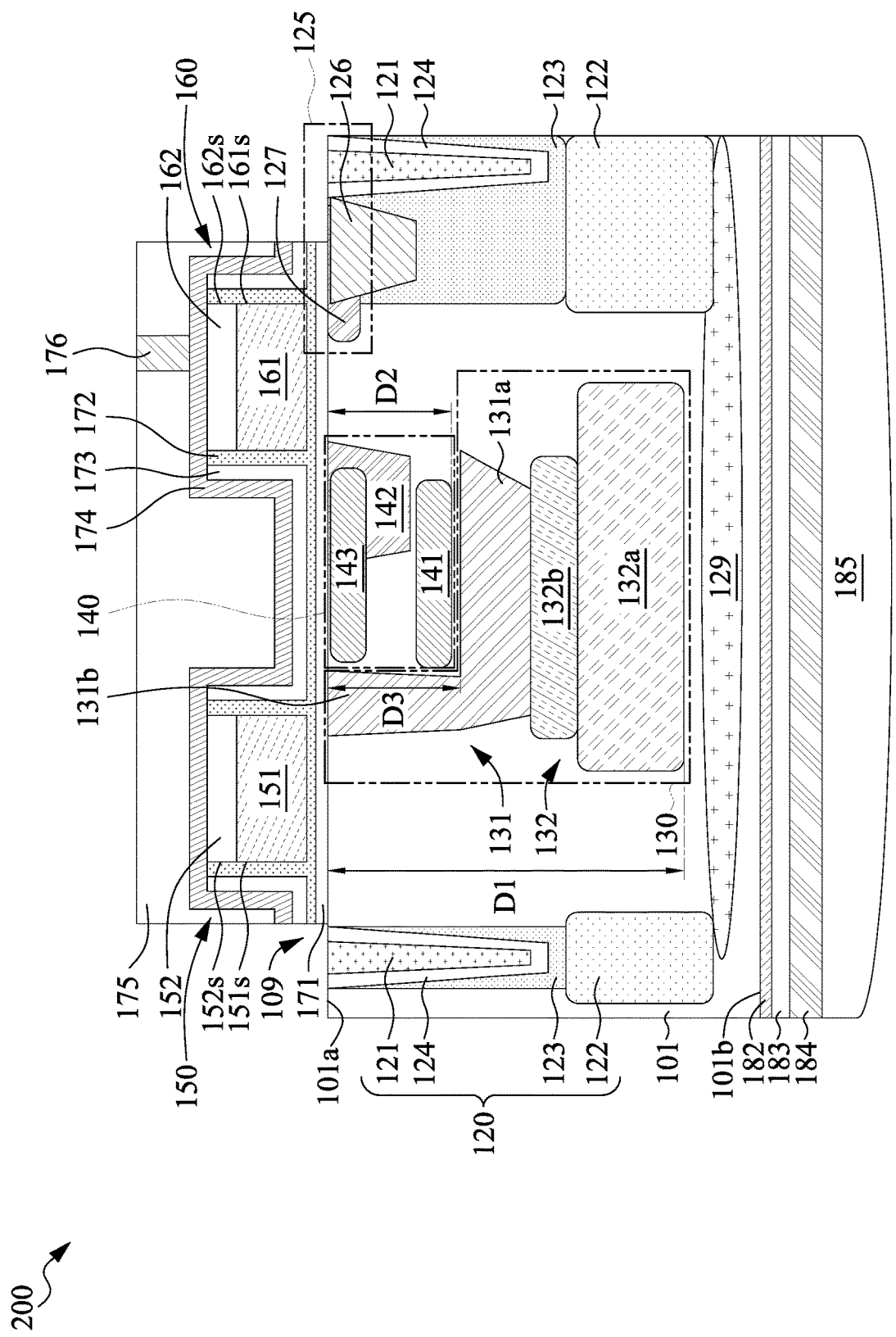
FIG. 2 is a cross-sectional view of the semiconductor structure along line A-A' in FIG. 1.

FIG. 1 is a schematic top view of a semiconductor structure in accordance with some embodiments of the present disclosure. FIG. 2 is a cross-sectional view of the semiconductor structure along a line A-A' in FIG. 1. In some embodiments, referring to FIG. 1, an image sensor device 100 includes a semiconductor substrate 101 having a first side 101a, wherein a trench isolation structure 120 extends from the first side 101a of the semiconductor substrate 101 into the semiconductor substrate 101 and divides the semiconductor substrate 101 into a plurality of sensing units 109. The image sensor device 100 may be a backside illuminated (BSI) image sensor device. However, it should he appreciated that embodiments of the disclosure may include a front side illuminated (FSI) image sensor.

In some embodiments, the image sensor device 100 includes an array of the sensing units 109. Each of the sensing units 109 includes a first pixel 130 and a second pixel 140. Each pixel (the first pixel 130 or the second pixel 140) represents a smallest unit area for the purpose of generating an image from the image sensor device 100. The region including the array of the sensing units 109 is herein referred to as an array region. The sensing units 109 in the array region may be arranged in rows R and columns C. For example, the array region may include M rows R and N columns C, in which M and N are integers in a range from 1 to $2^{16}$, such as from $2^8$ to $2^{14}$. The rows R of the sensing units 109 may be consecutively numbered with integers that range from 1 to M, and the columns C of the sensing units 109 may be consecutively numbered with integers that range from 1 to N. A sensing unit 109 Uij refers to a sensing unit 109 in the i-th row and in the j-th column.

In some embodiments, referring to FIGS. 1 and 2, each of the sensing units 109 includes the semiconductor structure 200. In some embodiments, the semiconductor structure 200 includes the semiconductor substrate 101 having the first side 101a, a trench isolation 121 extending from the first side 101a of the semiconductor substrate 101 into the semiconductor substrate 101, the first pixel 130 disposed in the semiconductor substrate 101 and adjacent to the trench isolation 121, and the second pixel 140 extending from the first side 101a of the semiconductor substrate 101 into the semiconductor substrate 101 and disposed over the first pixel 130. The semiconductor structure 200 further includes a first gate electrode 151 disposed on the first side 101a of the semiconductor substrate 101 and electrically connected to the first pixel 130, and a second gate electrode 161 disposed adjacent to the first gate electrode 151 and electrically connected to the second pixel 140. Each of the first pixel 130 and the second pixel 140 includes a p-n junction, and the second pixel 140 overlaps the first pixel 130 from a top view perspective.

In some embodiments, the first side 101a of the semiconductor substrate 101 is a front surface, and the second side 101b of the semiconductor substrate 101 opposite to the first side 101a of the semiconductor substrate 101 is a back surface. In some embodiments, the semiconductor substrate 101 comprises a semiconductor material such as silicon, germanium, a silicon-germanium alloy, a compound semiconductor material, or any other semiconductor material having a band gap that that does not exceed an energy of photons to be detected. The material within the semiconductor substrate 101 may be selected based on an energy range of the photons to be detected by the first pixel 130 or the second pixel 140.

In some embodiments, the first side 101a of the semiconductor substrate 101 may be suitably doped to have a first conductivity type, which may be p-type or n-type. In some embodiments, the first conductivity type is p-type. In some embodiments, the first side 101a of the semiconductor substrate 101 is configured to form various front-side device components thereon. In some embodiments, an epitaxial semiconductor deposition process may be performed to form a single crystalline epitaxial semiconductor material layer at the first side 101a of the semiconductor substrate 101.

In some embodiments, a deep p-well (DPW) region 122 is formed in the semiconductor substrate 101, and a cell p-well (CPW) region 123 is formed over the DPW region 122 in the semiconductor substrate 101. The DPW region 122 and the CPW region 123 are components to prevent cross-talk between adjacent sensing units 109. The DPW region 122 and the CPW region 123 may be formed by ion implantation of dopants of the first conductivity type around a region in which p-n junctions of the first pixel 130 and the second pixel 140 are to be subsequently formed. The DPW region 122 and the CPW region 123 are formed by, for example, implanting p-type dopants, such as boron or the like, through the front side 101a of the semiconductor substrate 101. In some embodiments, the DPW region 122 and the CPW region 123 may laterally surround the region including p-n junctions with a lateral opening in a segment at which a floating node 125 (also called a floating diffusion region) is to be subsequently formed. In some embodiments, an implant energy of the first conductivity type in the DPW region 122 may be in a range from 50 KeV to 2500 KeV. In some embodiments, an implant energy of the first conductivity type in the CPW region 123 may be in a range from 10 KeV to 200 KeV.

The trench isolation 121 is configured to provide device isolation between and from various semiconductor devices that may be subsequently formed. In some embodiments, the trench isolation 121 is configured to provide electrical isolation between and from various components within the sensing units 109. In some embodiments, the trench isolation 121 is disposed in the semiconductor substrate 101 to define a region of the sensing unit 109. In some embodiments, the trench isolation 121 is a shallow trench isolation (STI) or a deep trench isolation. In some embodiments, the trench isolation 121 is formed in an upper portion of the CPW region 123. In some embodiments, the trench isolation 121 includes dielectric material such as a silicon oxide, silicon dioxide or a field oxide (FOX).

In some embodiments, an epitaxial layer 124 surrounds the trench isolation 121. In some embodiments, the epitaxial layer 124 includes silicon germanium. In some embodiments, the entirety of the epitaxial layer 124 is doped, with a p-type or n-type dopant, or none of the epitaxial layer 124 is doped. In some embodiments, the trench isolation structure 120 includes the trench isolation 121 and the epitaxial layer 124 surrounding the trench isolation 121. In some embodiments, the trench isolation structure 120 includes the trench isolation 121, the epitaxial layer 124, the DPW region 122, and the CPW region 123.

In some embodiments, a trench 128 (shown in FIG. 6) is etched in the semiconductor substrate 101 in order to form the trench isolation 121. The epitaxial layer 124 may repair damage of the semiconductor substrate 101 caused by the etching of the trench. By repairing the damage of the semiconductor substrate 101, detrimental leakage current, which could otherwise occur due to the damage, may be reduced.

In some embodiments, the sensing unit 109 includes the first pixel 130 disposed in the semiconductor substrate 101 and surrounded by the trench isolation 121. A shape of the first pixel 130 is not particularly limited, and can be adjusted according to the actual requirement. The shape of the first pixel 130 may be a square, a rectangular, a circle, or a triangle from the top view perspective. In some embodiments, the shape of the first pixel 130 is a square from the top view perspective. In some embodiments, the trench isolation structure 120 surrounds the first pixel 130. In some embodiments, the first pixel 130 includes a first conductivity type region 131 and a second conductivity type region 132 disposed under the first conductivity type region 131.

In some embodiments, the first conductivity type region 131 has a first conductivity type and the second conductivity type region 132 has a second conductivity type opposite to the first conductivity type. In some embodiments, the first conductivity type region 131 is a p-type region, the second conductivity type region 132 is an n-type region, and the first conductivity type region 131 and the second conductivity type region 132 form a p-n junction. In some embodiments, the second conductivity type region 132 includes a deeper region 132a and an upper region 132b. In some embodiments, a dopant concentration of the first conductivity type in the first conductivity type region 131 of the first pixel 130 is in a range from $5.0 \times 10^{11}/cm^3$ to $1.0 \times 10$ m/cm$^3$. In some embodiments, an implant energy of the first conductivity type in the first conductivity type region 131 of the first pixel 130 is in a range from 1 KeV to 1000 KeV. In some embodiments, a dopant concentration of the second conductivity type in the second conductivity type region 132 of the first pixel 130 is in a range from $5.0 \times 10^{11}/cm^3$ to $1.0 \times 10^{14}/cm^3$. In some embodiments, an implant energy of the second conductivity type in the second conductivity type region 132 of the first pixel 130 is in a range from 200 KeV to 3000 KeV.

In some embodiments, the first conductivity type region 131 includes a main portion 131a disposed under the second pixel 140 and a connecting portion 131b extending from the first side 101a of the semiconductor substrate 101 to the main portion 131a. In some embodiments, the connecting portion 131b is attached to the main portion 131a. In some embodiments, the connecting portion 131b is disposed on a periphery of the main portion 131a. In some embodiments, a depth of the main portion 131a is greater than a depth of the connecting portion 131b. In some embodiments, an area of the main portion 131a is greater than an area of the connecting portion 131b. In some embodiments, the first conductivity type region 131 has an L-shape from a cross-sectional view.

In some embodiments, a portion of the main portion 131a of the first conductivity type region 131 is surrounded by the second conductivity type region 132. In some embodiments, the second conductivity type region 132 includes a deeper region 132a and an upper region 132b over the deeper region 132a. In some embodiments, the portion of the main portion 131a of the first conductivity type region 131 is surrounded by the upper region 132b of the second conductivity type region 132. In some embodiments, an implant energy of the second conductivity type in the deeper region 132a of the second conductivity type region 132 of the first pixel 130 is in a range from 200 KeV to 3000 KeV. In some embodiments, an implant energy of the second conductivity type in the upper region 132b of the second conductivity type region 132 of the first pixel 130 is in a range from 500 KeV to 1000 KeV. A depth D1 of the first pixel 130 is predetermined. In some embodiments, the depth D1 of the first pixel 130 is in a range from 1 to 10 μm.

In some embodiments, a diffusion region 129 is disposed under the first pixel 130. In some embodiments, the diffusion region 129 is disposed under the DWP regions 122. In some embodiments, the diffusion region 129 extends between the DWP regions 122. In some embodiments, the trench isolation structure 120 surrounds the diffusion region 129.

In some embodiments, the second pixel 140 extends from the first side 101a of the semiconductor substrate 101 into the semiconductor substrate 101. In some embodiments, the second pixel 140 is disposed over the first pixel 130 and overlaps the first pixel 130 from the top view perspective. In some embodiments, the second pixel 140 is disposed over and overlaps the main portion 131a of the first conductivity type region 131 of the first pixel 130 from the top view perspective. The shape of the second pixel 140 is not particularly limited, and can be adjusted according to the actual requirement. The shape of the second pixel 140 may be a square, a rectangular, a circle, or a triangle from the top view perspective. In some embodiments, the shape of the second pixel 140 is a square from the top view perspective.

In some embodiments, the second pixel 140 includes a first conductivity type region 143 and a second conductivity type region 142 disposed under the first conductivity type region 143. In some embodiments, the first conductivity type region 143 is a p-type region, the second conductivity type region 142 is an n-type region, and the first conductivity type region 143 and the second conductivity type region 142 form a p-n junction. In some embodiments, a dopant concentration of the first conductivity type in the first conductivity type region 143 of the second pixel 140 is in a range from $1.0 \times 10^{11}/cm^3$ to $1.0 \times 10^{13}/cm^3$. In some embodiments, an implant energy of the first conductivity type in the first conductivity type region 143 of the second pixel 140 is in a range from 1 KeV to 50 KeV. In some embodiments, a dopant concentration of the second conductivity type in the second conductivity type region 142 of the second pixel 140 is in a range from $1.0 \times 10^{11}/cm^3$ to $1.0 \times 10^{13}/cm^3$. In some embodiments, an implant energy of the second conductivity type in the second conductivity type region 142 of the second pixel 140 is in a range from 1 KeV to 500 KeV.

In some embodiments, the second pixel 140 further includes a diffusion region 141 disposed under the first conductivity type region 143 and the second conductivity type region 142. In some embodiments, the diffusion region 141 is an isolation region. In some embodiments, the diffusion region 141 is an isolation region having the first conductivity type. In some embodiments, the diffusion region 141 is a p-type isolation region. In some embodiments, an implant energy of the first conductivity type in the diffusion region 141 of the second pixel 140 is in a range from 200 KeV to 900 KeV.

In some embodiments, a depth D2 of the second pixel 140 is predetermined. In some embodiments, the depth D2 of the second pixel 140 in the semiconductor substrate 101 is less than the depth D1 of the first pixel 130 in the semiconductor substrate 101. In some embodiments, the depth D2 of the second pixel 140 is relative to a depth D3 of the connecting portion 131b of the first conductivity type region 131 in the semiconductor substrate 101. In some embodiments, the depth D2 of the second pixel 140 is similar to the depth D3 of the connecting portion 131b of the first conductivity type region 131. In some embodiments, the depth D2 of the second pixel 140 is in a range from 0.01 to 1 μm.

Figure 3:
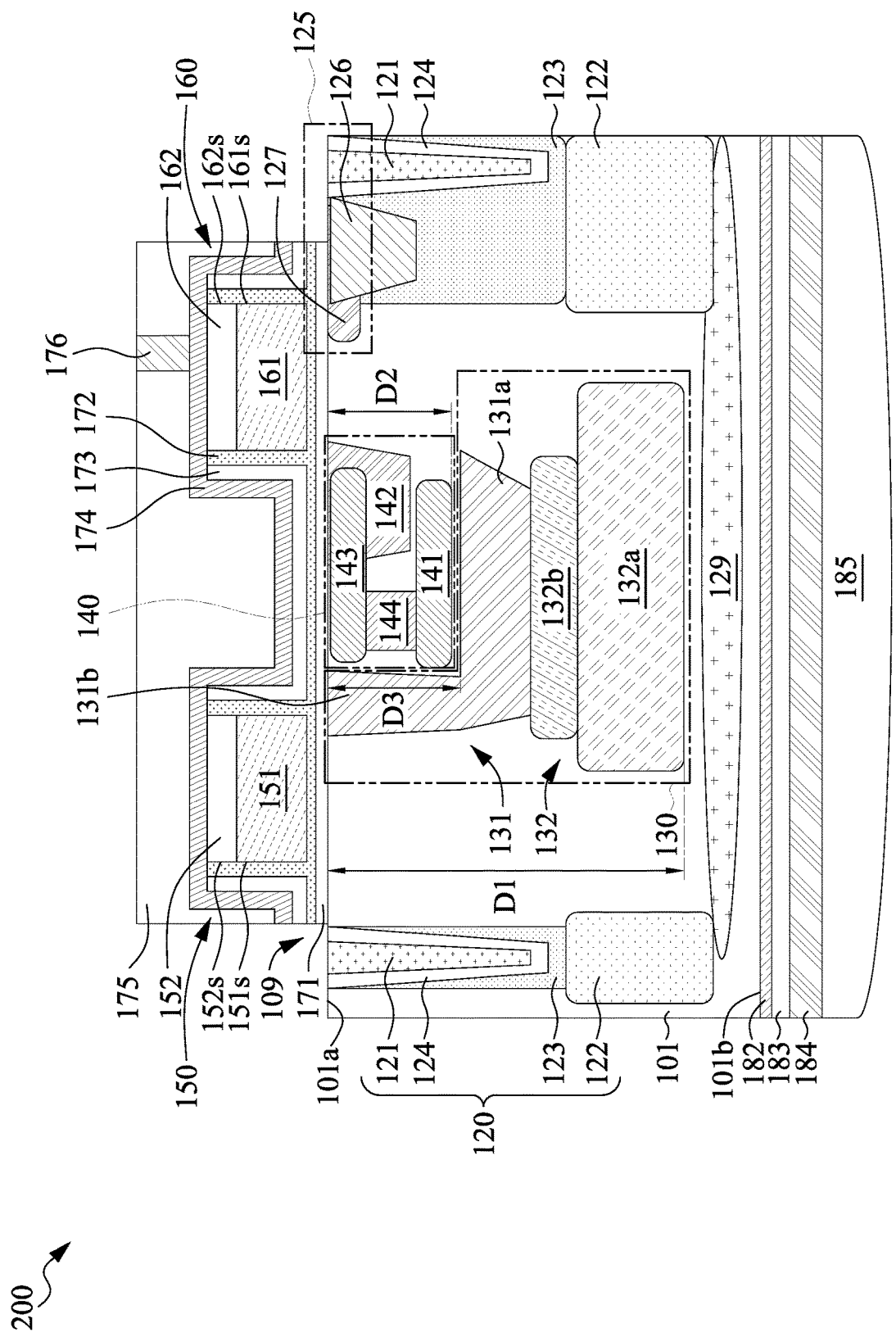
FIG. 3 is a cross-sectional view of the semiconductor structure along line A-A' in FIG. 1.

FIG. 3 is a cross-sectional view of the semiconductor structure along the line A-A' in FIG. 1. In some embodiments, referring to FIG. 3, the second pixel 140 further includes a diffusion region 144 disposed between the diffusion region 141 and the first conductivity type region 143. In some embodiments, the diffusion region 144 is laterally between the second conductivity type region 142 and the connecting portion 131b of the first conductivity type region 131 of the first pixel 130. In some embodiments, the diffusion region 144 is an isolation region. In some embodiments, the diffusion region 144 is an isolation region having the first conductivity type. In some embodiments, the diffusion region 144 is a p-type isolation region.

Figure 4:
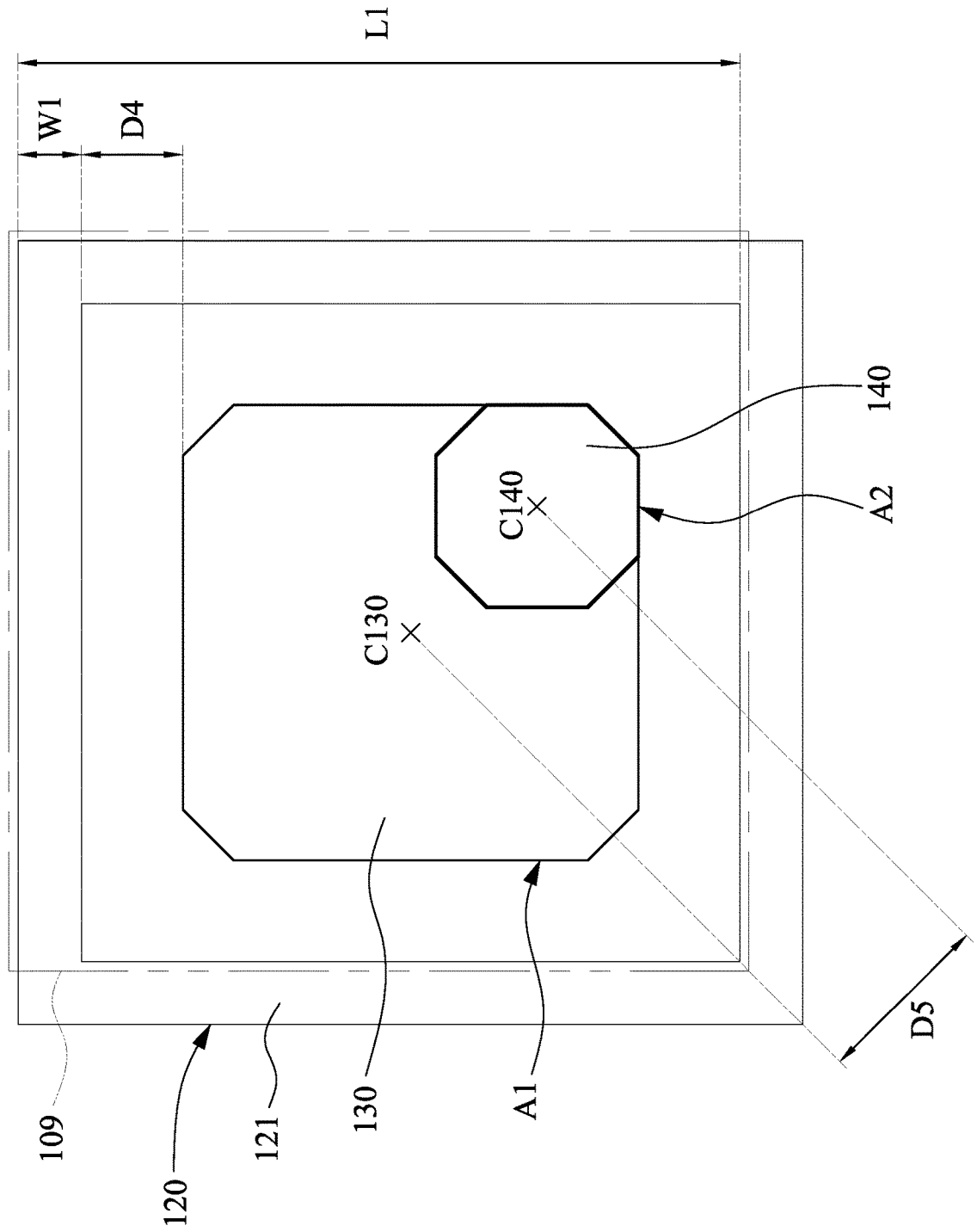
FIG. 4 is an enlarged schematic top view of a portion of a semiconductor structure in accordance with some embodiments of the present disclosure.

FIG. 4 is an enlarged top view of a portion of the semiconductor structure in FIG. 1. In some embodiments, referring to FIGS. 1, 2 and 4, the sensing unit 109 includes the first pixel 130 and the second pixel 140 surrounded by the trench isolation structure 120. In some embodiments, the trench isolation 121 surrounds the first pixel 130 and the second pixel 140. The shape of the sensing unit 109 is not particularly limited, and may be a polygon from the top view perspective as shown in FIGS. 1 and 4. The shape of the sensing unit 109 may be a square, a rectangular, a circle, or a triangle from the top view perspective. In some embodiments, the shape of the sensing unit 109 is a square from the top view perspective. In some embodiments, a length L1 of the sensing unit 109 ranges between 0.5 and 10 μm. In some embodiments, a width of the trench isolation 121 is between 0.1 and 0.5 μm. In some embodiments, a distance D4 between the trench isolation 121 and the first pixel 130 is less than 0.3 μm.

In some embodiments, the second pixel 140 overlaps the first pixel 130 from the top view perspective. In some embodiments, the entire second pixel 140 overlaps the first pixel 130. In some embodiments, an area A1 of the first pixel 130 is greater than an area A2 of the second pixel 140. In some embodiments, a ratio of the area A1 of the first pixel 130 to the area A2 of the second pixel 140 is between about 49:32 and about 80:1.

In some embodiments, the first pixel 130 has a center C130 and the second pixel 140 has a center C140. In some embodiments, a distance D5 between the center C130 of the first pixel 130 and the center C140 of the second pixel 140 is less than 10 μm. In some embodiments, the distance D5 between the center C130 of the first pixel 130 and the center C140 of the second pixel 140 is between 0.1 and 9 In some embodiments, the center C140 is offset from the center C130 from the top view perspective. In some embodiments, the center C140 overlaps the center C130 from the top view perspective.

In some embodiments, referring back to FIGS. 1 and 2, a source/drain region 126 is formed in the semiconductor substrate 101 and in the CPW region 123 adjacent to the second pixel 140. In some embodiments, an extension region 127 extends from the source/drain region 126 toward the second pixel 140.

In some embodiments, a floating node 125 includes the source/drain region 126 and the extension region 127. In some embodiments, the floating node 125 is laterally spaced apart from the first pixel 130 and the second pixel 140. In some embodiments, the second pixel 140 is laterally disposed between the floating node 125 and the connection portion 131b of the first conductivity type region 131 of the first pixel 130. In some embodiments, the floating node 125 is shared by four sensing units 109.

In some embodiments, a gate dielectric layer 171 is formed over the first side 101a of the semiconductor substrate 101, and the first gate electrode 151 and the second gate electrode 161 are disposed over the gate dielectric layer 171. The first gate electrode 151 and the second gate electrode 161 may include polysilicon or the like. A configuration, size and shape of the first gate electrode 151 are not particularly limited, and may be similar to or different from those of the second gate electrode 161. In some embodiments, an area of the first gate electrode 151 is greater than an area of the second gate electrode 161. In some embodiments, a width of the first gate electrode 151 is greater than a width the second gate electrode 161. In some embodiments, a height of the first gate electrode 151 is greater than a height the second gate electrode 161.

In some embodiments, each of the sensing units 109 includes the first gate electrode 151 and the second gate electrode 161 surrounded by the corresponding trench isolation 121 from the top view perspective. In some embodiments, the first gate electrode 151 and the second gate electrode 161 are separated from each other and disposed at opposite sides in the sensing unit 109. In some embodiments, the first gate electrode 151 and the second gate electrode 161 are disposed at opposite corners in the sensing unit 109. In some embodiments, the first gate electrode 151 is spaced apart from the second gate electrode 161, and at least a portion of the first pixel 130 and a portion of the second pixel 140 are disposed between the first gate electrode 151 and the second gate electrode 161.

In some embodiments, from the top view perspective, the first gate electrode 151 is disposed laterally between the first pixel 130 and the trench isolation 121 adjacent to the first pixel 130, and is disposed partially over the first conductivity type region 131 of the first pixel 130. In some embodiments, the first gate electrode 151 is disposed partially over the connecting portion 131b of the first conductivity type region 131 of the first pixel 130. In some embodiments, from the top view perspective, the second gate electrode 161 is disposed laterally between the second pixel 140 and the trench isolation 121 adjacent to the second pixel 140. In some embodiments, the second gate electrode 161 overlaps the first pixel 130 from the top view perspective. In some embodiments, the second gate electrode 161 is disposed partially over the extension region 127.

Each of the first gate electrode 151 and the second gate electrode 161 has an upper region 152 or 162, respectively, disposed thereon. In some embodiments, the upper regions 152 and 162 have the second conductivity type. In some embodiments, the upper regions 152 and 162 are n-type doped upper regions. In some embodiments, the first gate electrode 151 and the upper region 152 form a first gate structure 150. In some embodiments, the second gate electrode 161 and the upper region 162 form a second gate structure 160.

In some embodiments, a dielectric layer 172 is disposed over the gate dielectric layer 171 and attached to sidewalls 151s, 161s of the first gate electrode 151 and the second gate electrode 161 and sidewalls 152s, 162s of the upper regions 152 and 162. In some embodiments, the dielectric layer 172 is disposed over the gate dielectric layer 171 and conformal to the first gate structure 150 and the second gate structure 160. In some embodiments, top surfaces of the upper regions 152 and 162 are exposed through the dielectric layer 172. In some embodiments, the dielectric layer 172 includes tetraethyl orthosilicate (TEOS) or the like. In some embodiments, a resist protective layer (RPL) 173 is conformally disposed over the dielectric layer 172. In some embodiments, the RPL 173 includes silicon oxide or the like. In some embodiments, an etch stop layer (ESL) 174 is conformally deposited over the RPL 173. In some embodiments, the ESL 174 includes silicon nitride or the like.

In some embodiments, an inter-layer dielectric (ILD) 175 is deposited over the ESL 174, the first gate structure 150 and the second gate structure 160. In some embodiments, the ILD 175 includes silicon oxide, borophosphosilicate glass (BPSG), phosphosilicate glass (PSG), fluorinated silicate glass (FSG), carbon-doped silicon oxide, or the like. In some embodiments, a contact 176 is disposed in and extends through the ILD 175. In some embodiments, the contact 176 is electrically connected to the first gate structure 150 or the second gate structure 160. The contact 176 includes conductive material such as a copper, aluminum, or the like.

In some embodiments, a doped layer 182 is disposed on the second side 101b of the semiconductor substrate 101. In some embodiments, the doped layer 182 includes a first conductivity type dopant, such as a p-type dopant. In some embodiments, the doped layer 182 is a thin p+ layer. The doped layer 182 may be formed on the second side 101b of the semiconductor substrate 101 to increase a number of photons converted into electrons.

In some embodiments, a dielectric layer 183 is formed over the doped layer 182. The dielectric layer 182 includes silicon nitride, silicon oxide, silicon oxynitride, silicon oxycarbide, a high-k dielectric such as a dielectric with a dielectric constant greater than 2, the like, or a combination thereof. In some embodiments, a color filter layer 184 is formed over the dielectric layer 183. The color filter layer 184 may be used to allow specific wavelengths of light to pass while reflecting other wavelengths, thereby allowing the semiconductor structure 200 to determine the color of the light being received by the first pixel 130 and/or the second pixel 140. The color filter layer 184 may be various colors, such as red, green or blue. In some embodiments, the color filter layer 184 includes polymethyl-methacrylate (PMMA) or polyglycidylmethacrylate (PGMS), and may further include a pigmented or dyed material. In some embodiments, a microlens layer 185 is formed over the color filter layer 184. The microlens layer 185 may be formed of any material that has a high transmittance, such as acrylic polymer.

Figure 5:
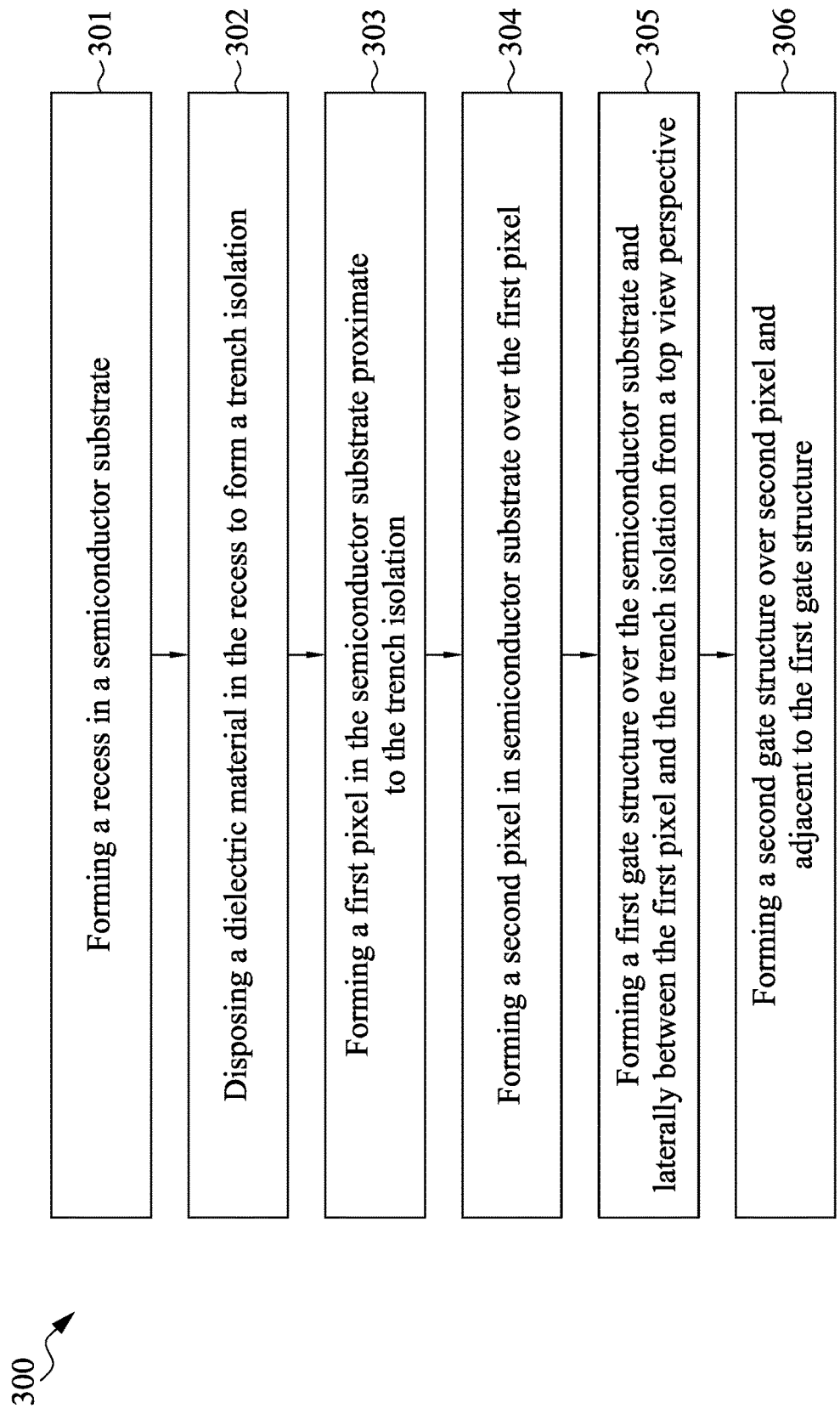
FIG. 5 is a flow diagram of a method of manufacturing a semiconductor structure in accordance with some embodiments of the present disclosure.

FIG. 5 is a flowchart of a method 300 for manufacturing a semiconductor structure in accordance with some embodiments of the present disclosure. As illustrated in FIG. 5, the method 300 includes several operations: (301) forming a recess in a semiconductor substrate; (302) disposing a dielectric material in the recess to form a trench isolation; (303) forming a first pixel in the semiconductor substrate proximate to the trench isolation; (304) forming a second pixel in the semiconductor substrate over the first pixel; (305) forming a first gate structure over the semiconductor substrate and laterally between the first pixel and the trench isolation; and (306) forming a second gate structure over second pixel and adjacent to the first gate structure. The formation of the semiconductor structure includes forming the second pixel overlapping the first pixel from the top view perspective, wherein the first pixel is electrically connected to the first gate structure, and the second pixel is electrically connected to the second gate structure.

FIGS. 6 to 16 are schematic cross-sectional views of a semiconductor structure during various stages of manufacturing in accordance with some embodiments of the present disclosure. In some embodiments, the method 300 can be applied to form the semiconductor structure 200 as illustrated in FIGS. 2 and 3.

Figure 6:
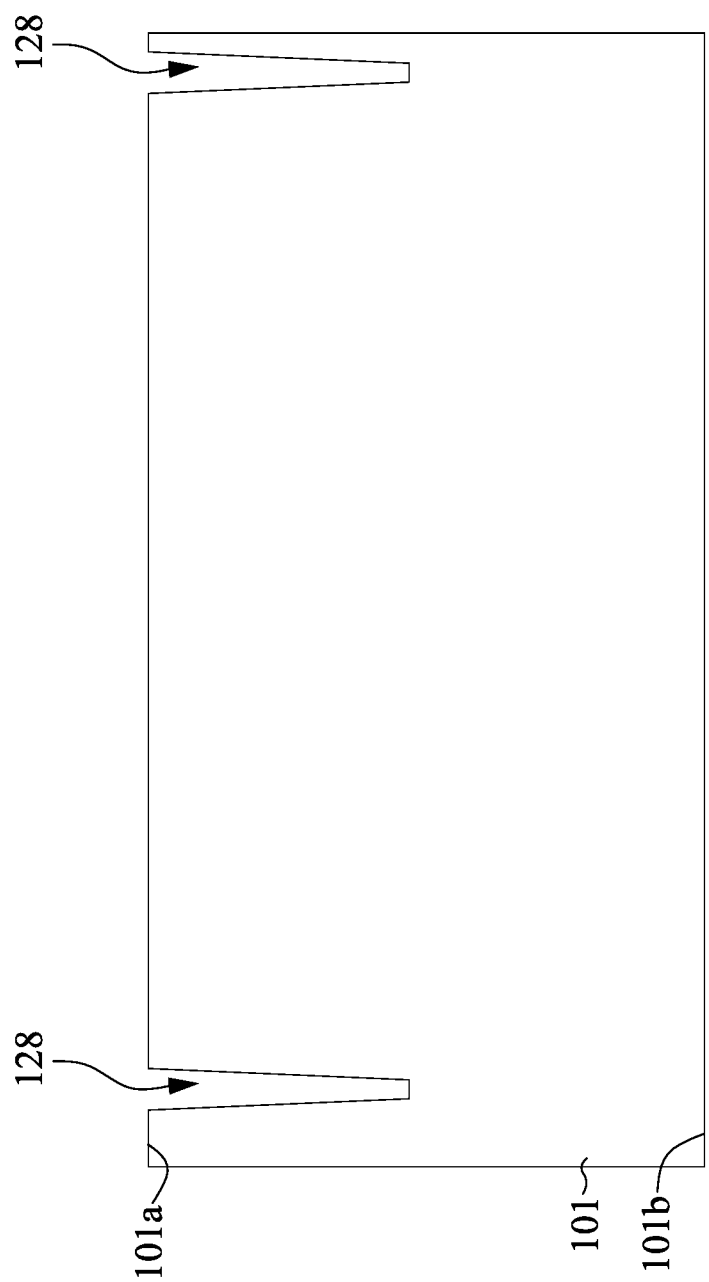
FIGS. 6 to 16 are cross-sectional views of a semiconductor structure during various stages of manufacturing in accordance with some embodiments of the present disclosure.

As illustrated in FIG. 6, in operation 301, a recess 128 is formed in a semiconductor substrate 101. In some embodiments, the recess 128 is formed from a first side 101a of the semiconductor substrate 101 into the semiconductor substrate 101. In some embodiments, the recess 128 is a trench. In some embodiments, the recess 128 defines a region configured to form a sensing unit 109 as illustrated in FIGS. 2 and 3. The semiconductor substrate 101 as provided at this processing step may have a sufficiently great thickness to be able to withstand standard complementary metal-oxide-semiconductor (CMOS) processing steps. For example, the thickness of the semiconductor substrate 101 may be in a range from 200 μm to 1 mm, although lesser and greater thicknesses may also be used. In some embodiments, the recess 128 is formed by etching. The etch may be performed using acceptable photolithography techniques. Although not explicitly illustrated, a mask can be used during the photolithography process and used during a subsequent epitaxial growth to prevent nucleation outside of the trench 128.

Figure 7:
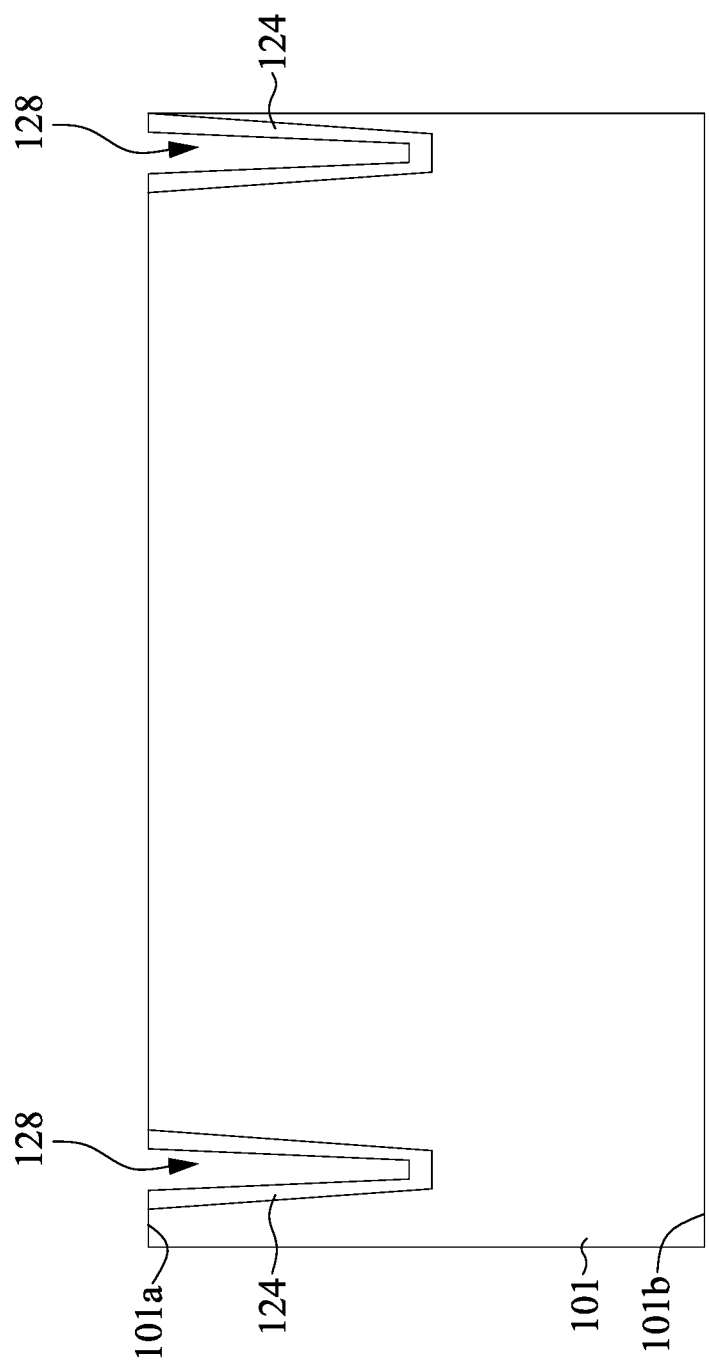

In some embodiments, as illustrated in FIG. 7, an epitaxial layer 124 is epitaxially grown on surfaces of the trench 128. An appropriate epitaxial growth process may be used to deposit the epitaxial layer 124, such as selective epitaxial growth (SEG), molecular beam epitaxy (MBE), metalorganic chemical vapor deposition (MOCVD), the like, or a combination thereof.

Figure 8:
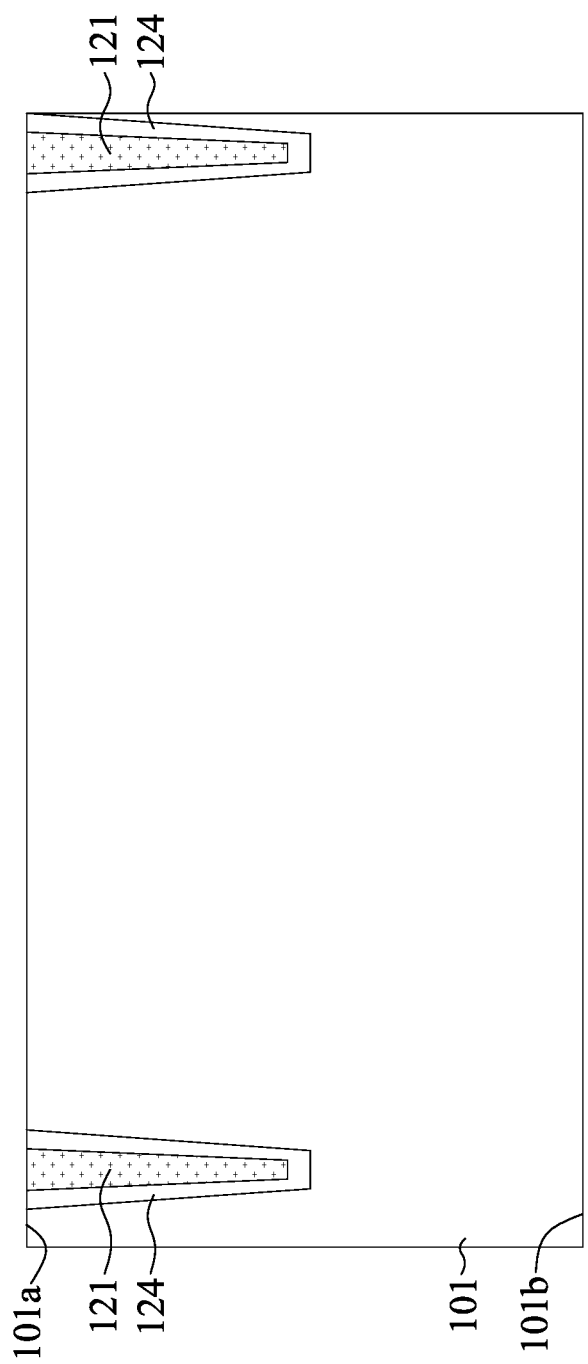

In some embodiments, as illustrated in FIG. 8, in operation 302, a dielectric material is deposited into the recess 128 to form a trench isolation 121. In some embodiments, the dielectric material is deposited in the recess 128 over the epitaxial layer 124. The dielectric material can be deposited by a high-density plasma chemical vapor deposition (HDP-CVD), plasma-enhanced chemical vapor deposition (PECVD), a thermal CVD, the like, or a combination thereof. Further, the dielectric material can be any dielectric material, such as an oxide, formed by an acceptable process. A planarization, such as by a chemical mechanical polish (CMP), may be performed on the first side 101a after the deposition of the dielectric material into the recess 128 to form the trench isolation 121.

Figure 9:
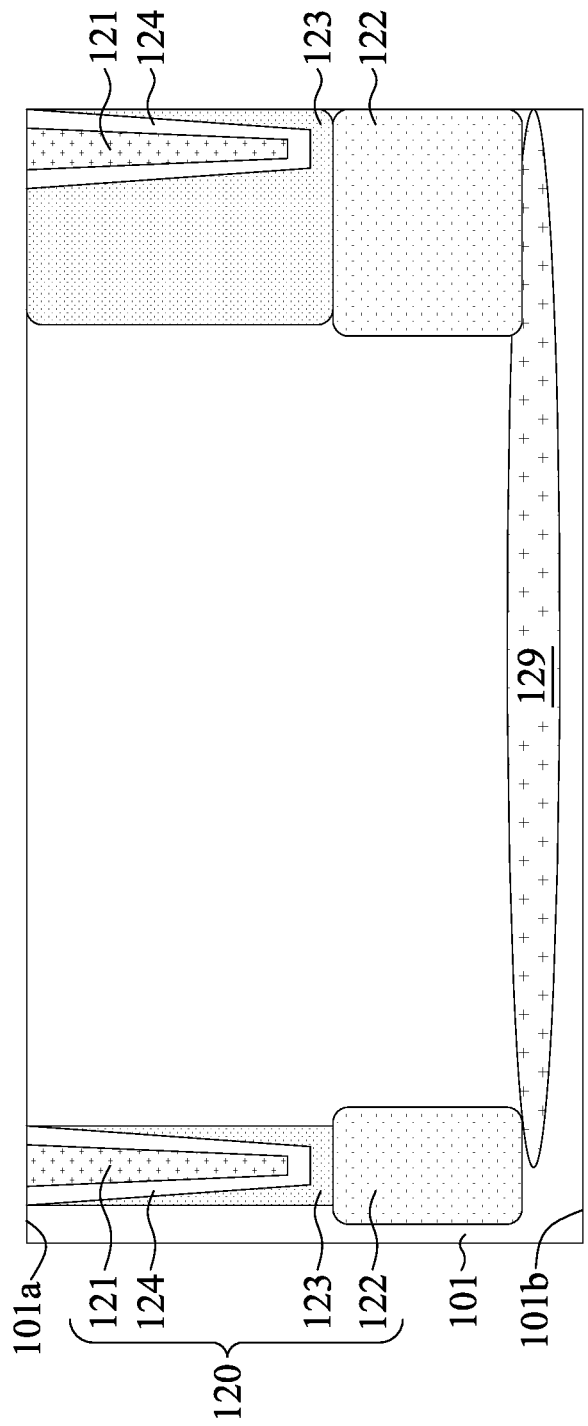

In some embodiments, as illustrated in FIG. 9, an isolation structure 120 is formed within the semiconductor substrate 101. In some embodiments, a deep p-well (DPW) region 122 is formed in the semiconductor substrate 101, and a cell p-well (CPW) region 123 is formed over the DPW region 122 in the semiconductor substrate 101, wherein the CPW region 123 surrounds the trench isolation 121 and the epitaxial layer 124. In some embodiments, the DPW region 122 and the CPW region 123 are formed by implanting first conductivity type dopants through the front side 101a of the semiconductor substrate 101. In some embodiments, the DPW region 122 and the CPW region 123 are formed by implanting p-type dopants, such as boron or the like. In some embodiments, a diffusion region 129 is formed in the semiconductor substrate 101 surrounded by the DPW region 122. In some embodiments, a sequence of the formation of the DPW region 122, the CPW region 123 and the diffusion region 129 is not limited. In some embodiments, the diffusion region 129 is formed before the formation of the trench isolation 121 and the epitaxial layer 124. In some embodiments, the diffusion region 129 is formed after the formation of the DPW region 122 and the CPW region 123. In some embodiments, after the CPW region 123 is formed, the trench 128 is etched and formed within the CPW region 123.

Figure 10:
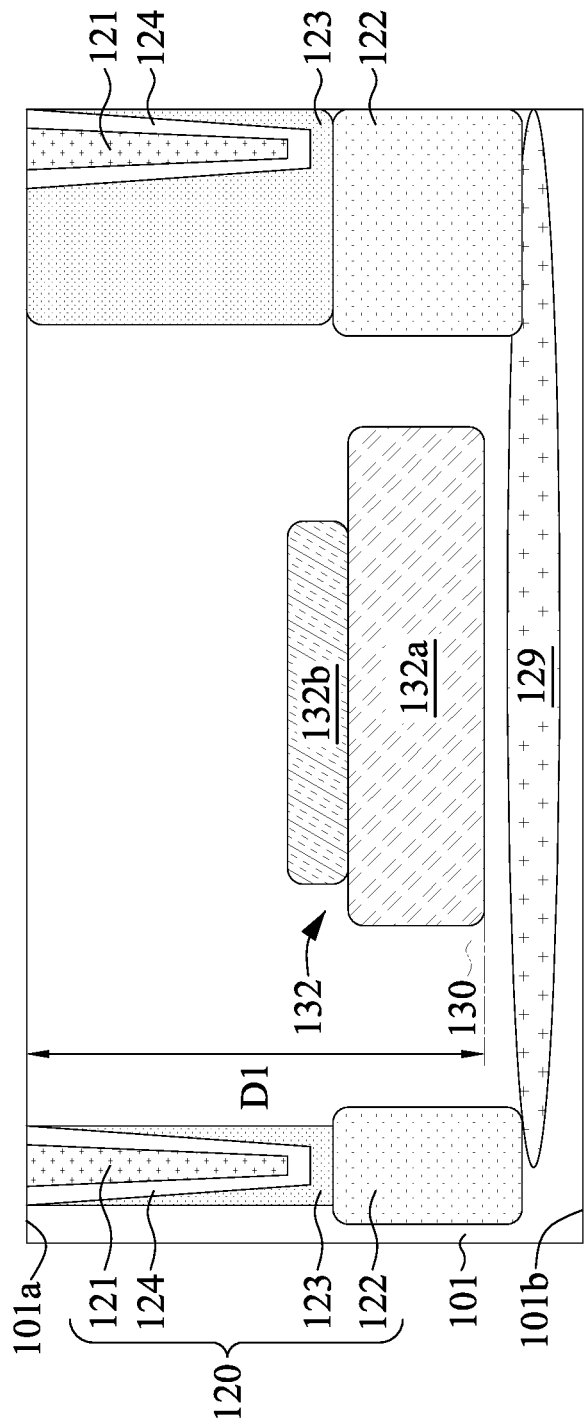
Figure 11:
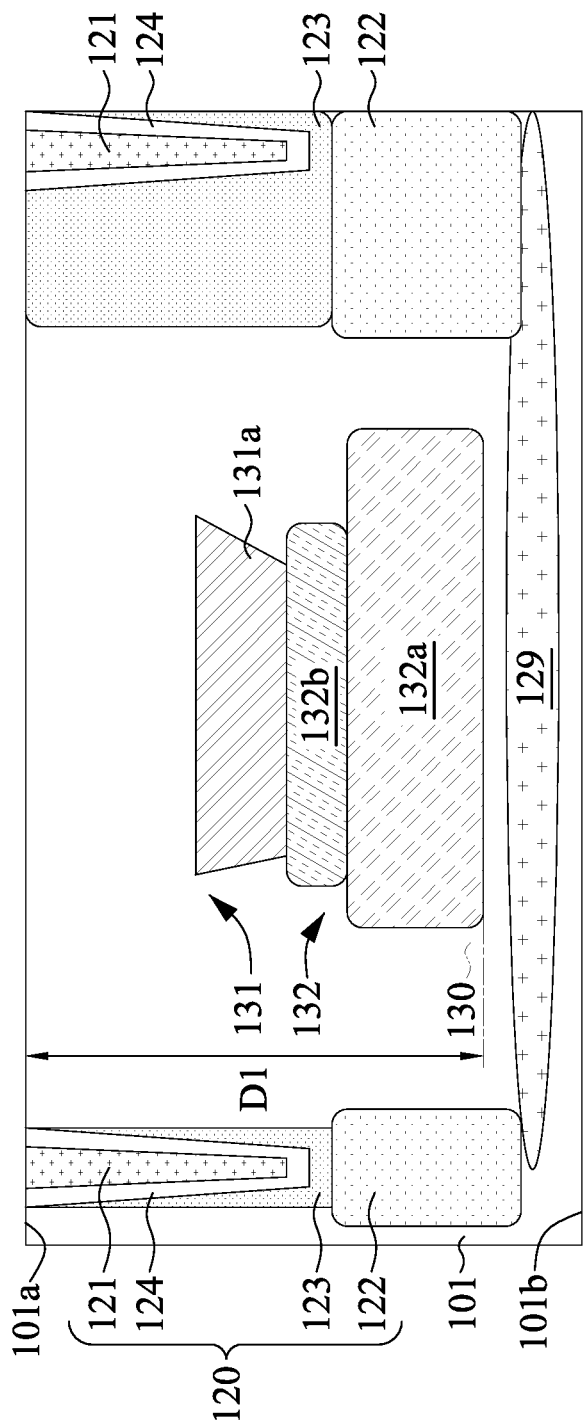
Figure 12:
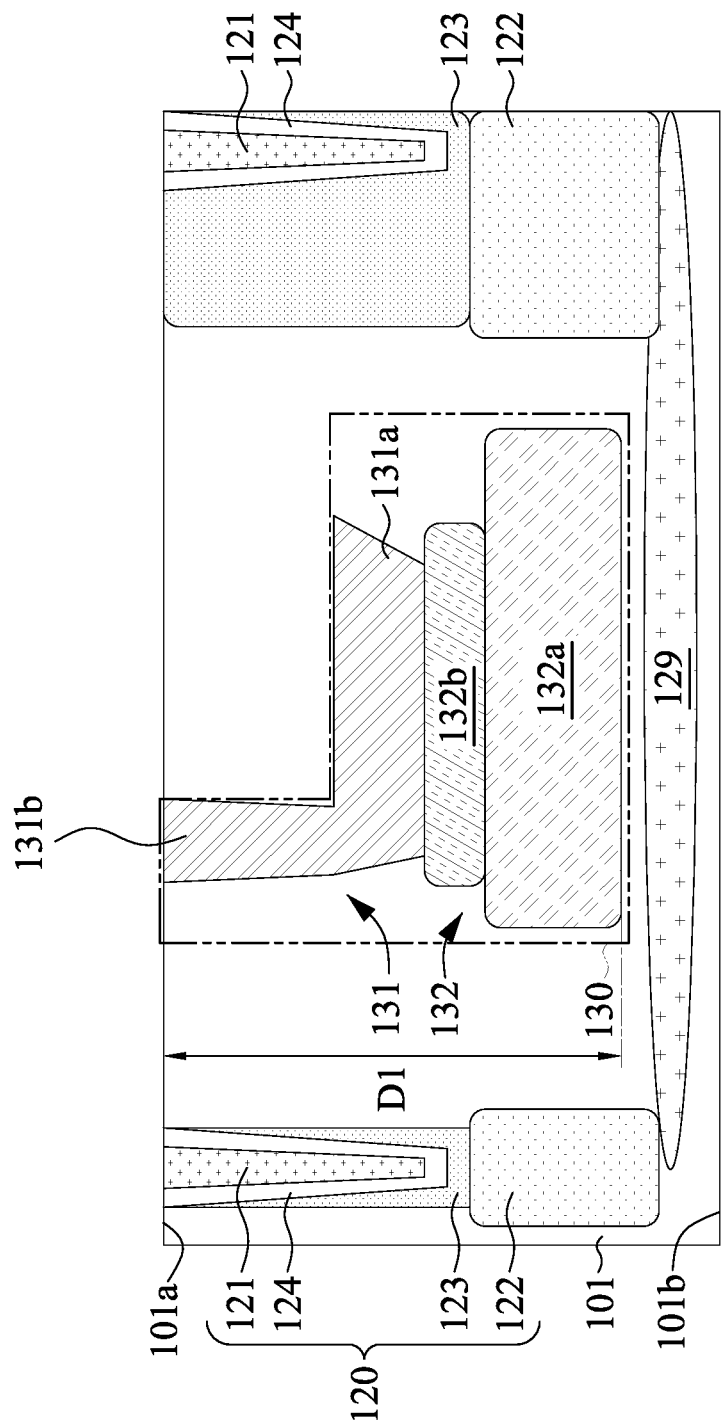

In some embodiments, as illustrated in FIGS. 10 to 12, in operation 303, a first pixel 130 is formed in the semiconductor substrate 101 proximate to the trench isolation 121. In some embodiments, referring to FIG. 10, formation of the first pixel 130 includes forming a second conductivity type region 132 in the semiconductor substrate 101 at a depth D1. In some embodiments, "depth" of the present disclosure is measured from the first side 101a of the substrate 101 toward the second side 101b of the substrate 101. In some embodiments, formation of the second conductivity type region 132 includes forming a deeper region 132a and forming an upper region 132b. Dopants of a second conductivity type may be implanted through the front side 101a of the semiconductor substrate 101 using at least one masked ion implantation process and follow by an annealing process. The second conductivity type may be n-type, which is opposite of the first conductivity type. The deeper region 132a and the upper region 132b of the second conductivity type region 132 can be formed sequentially by appropriate implantation through the front side 101a of the semiconductor substrate 101 and follow by an annealing process.

In some embodiments, referring to FIG. 11, formation of the first pixel 130 includes forming a main portion 131a of a first conductivity type region 131 disposed over the second conductivity type region 132. The main portion 131a of the first conductivity type region 131 can be formed by appropriate implantation through the front side 101a of the semiconductor substrate 101.

In some embodiments, referring to FIG. 12, formation of the first pixel 130 includes forming a connecting portion 131b of the first conductivity type region 131 over the main portion 131a of the first conductivity type region 131. A top surface of the connecting portion 131b is exposed through the first side 101a of the semiconductor substrate 101. Dopants of the first conductivity type may be implanted through the front side 101a of the semiconductor substrate 101 using one mask for an ion implantation process of formation of the main portion 131a of the first conductivity type region 131, and using another mask for an ion implantation process of formation of the connecting portion 131b of the first conductivity type region 131. In some embodiments, different masks are used to form the main portion 131a and the connecting portion 131b of the first conductivity type region 131.

Figure 13:
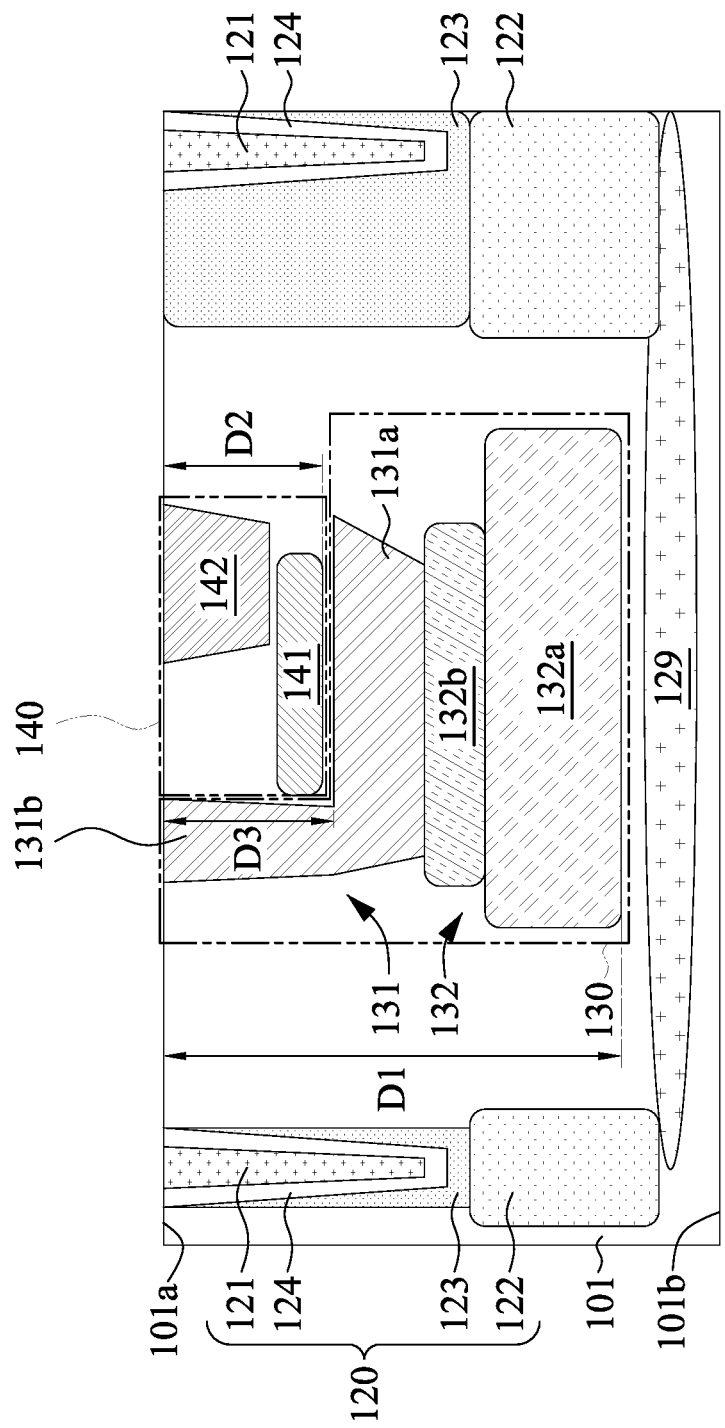
Figure 14:
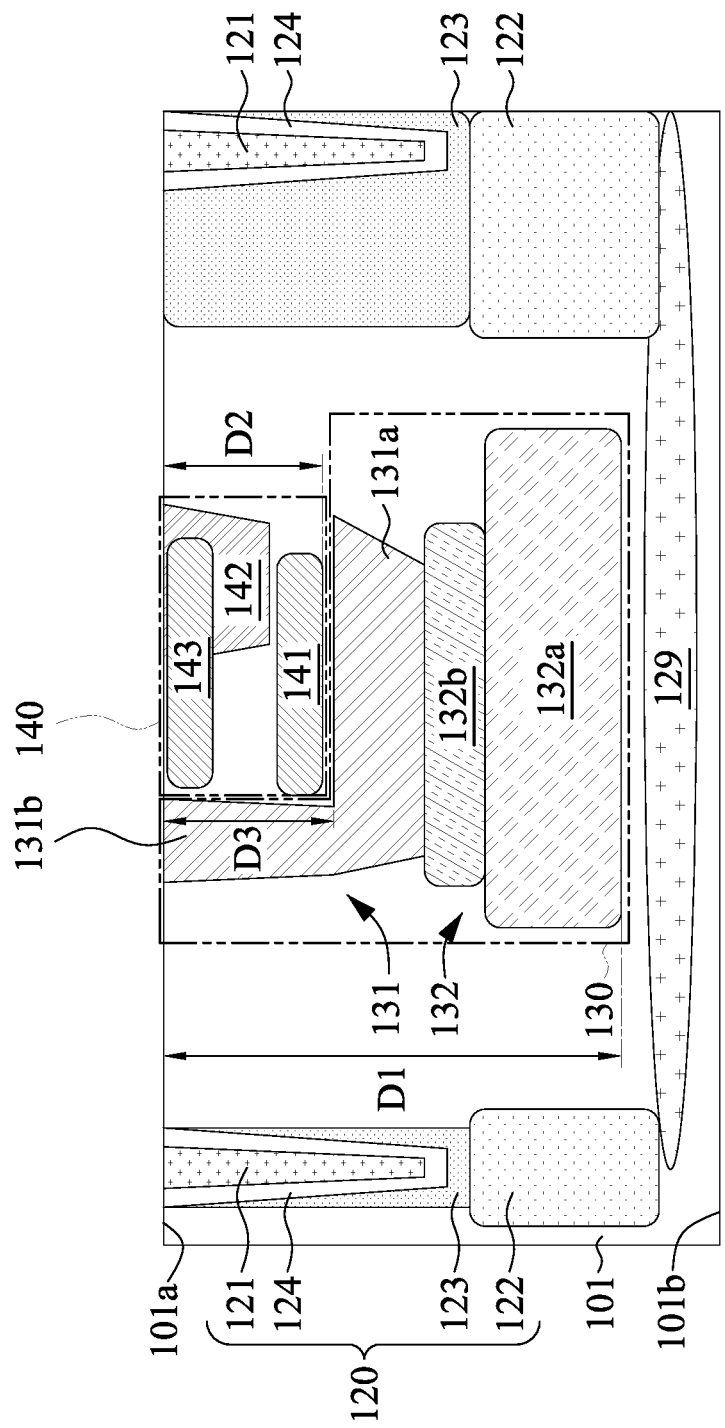

In some embodiments, as illustrated in FIGS. 13 to 14, in operation 304, a second pixel 140 is formed over the main portion 131a and adjacent to the connecting portion 131b of the first conductivity type region 131 of the first pixel 130. The second pixel 140 is formed at a depth D2 similar to a depth D3 of the connecting portion 131b of the first conductivity type region 131.

In some embodiments, referring to FIG. 13, formation of the second pixel 140 includes forming a diffusion region 141 of the second pixel 140 in the semiconductor substrate 101 and over the main portion 131a of the first conductivity type region 131 of the first pixel 130. In some embodiments, formation of the second pixel 140 includes forming a second conductivity type region 142 over the diffusion region 141. In some embodiments, the connecting portion 131b of the first conductivity type region 131 of the first pixel 130 and the diffusion region 141 of the second pixel 140 overlap the main portion 131a of the first conductivity type region 131 of the first pixel 130 from the top view perspective. The diffusion region 141 and the second conductivity type region 142 can be formed by appropriate implantation through the front side 101a of the semiconductor substrate 101.

In some embodiments, referring to FIG. 14, formation of the second pixel 140 includes forming a first conductivity type region 143 of the second pixel 140 over a portion of the second conductivity type region 142 of the second pixel 140. In some embodiments, a top surface of the second conductivity type region 142 of the second pixel 140 is exposed through the first side 101a of the semiconductor substrate 101. The first conductivity type region 143 can be formed by appropriate implantation through the front side 101a of the semiconductor substrate 101.

Figure 15:
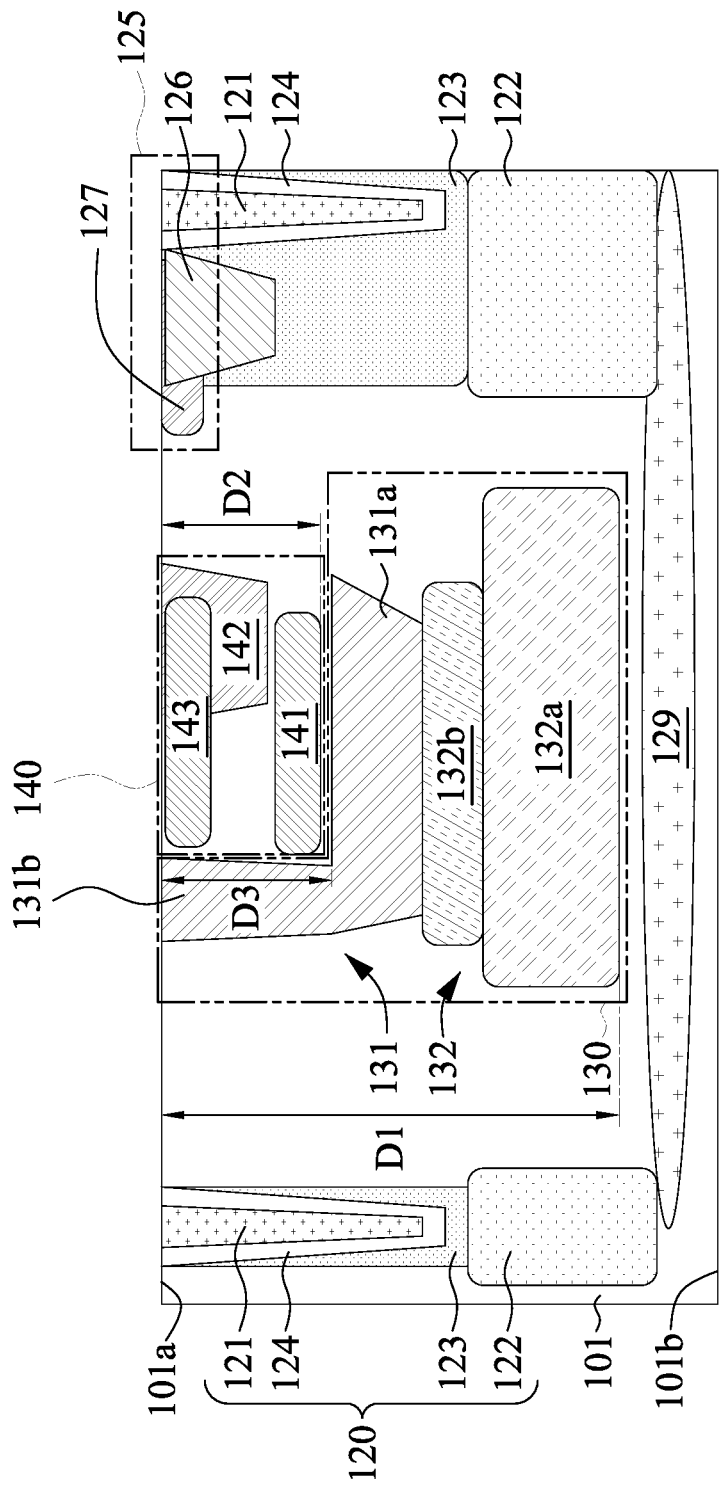

In some embodiments, referring to FIG. 15, the method 300 further includes forming a floating node 125 in the semiconductor substrate 101 and laterally spaced apart from the first pixel 130 and the second pixel 140. In some embodiments, the method 300 includes forming a source/drain region 126 in the semiconductor substrate 101 and in the CPW region 123 adjacent to the second pixel 140. In some embodiments, the method 300 includes forming an extension region 127 extending from the source/drain region 126 toward the second pixel 140. The source/drain region 126 and the extension region 127 can be formed by appropriate implantation through the front side 101a of the semiconductor substrate 101.

Figure 16:
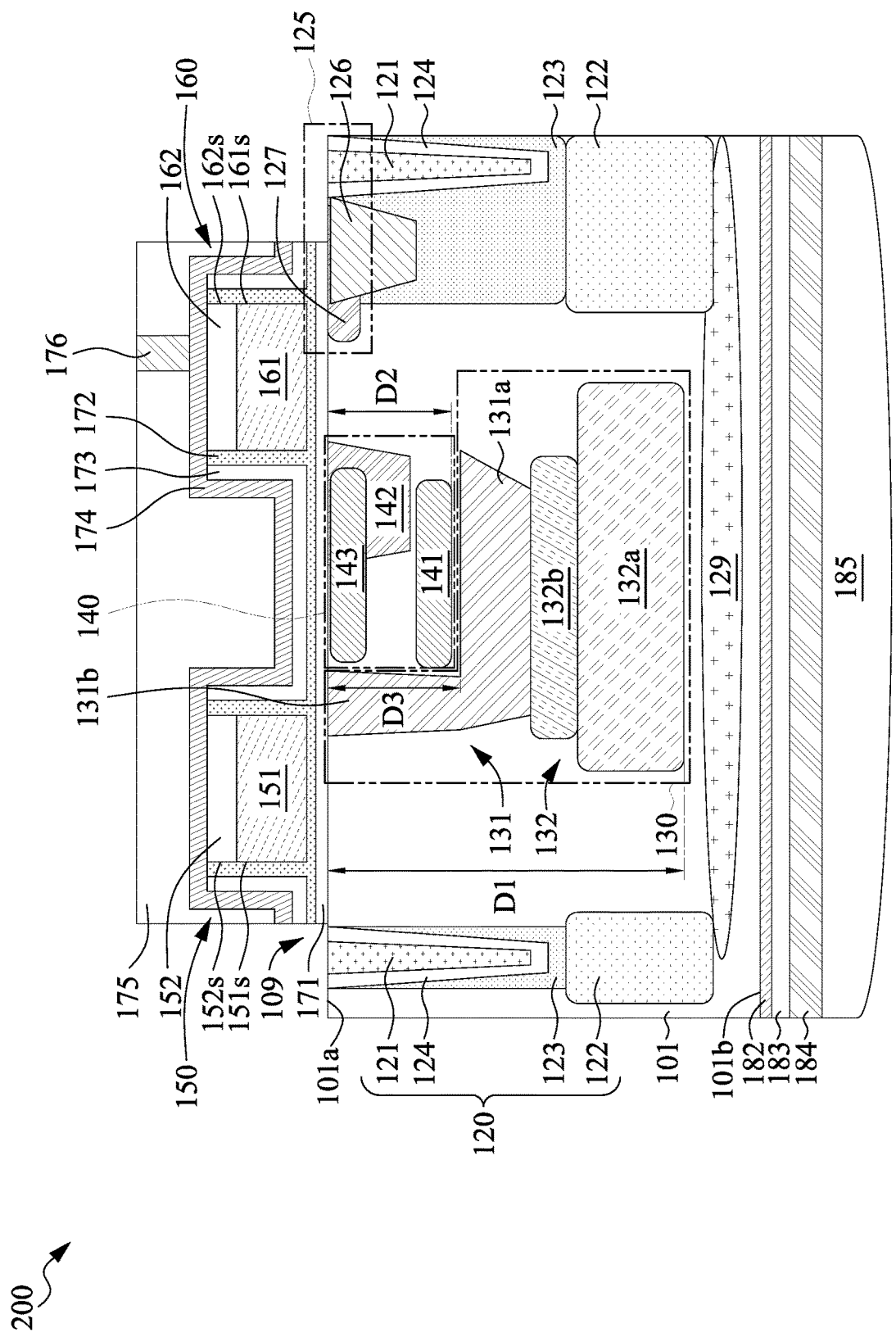

In some embodiments, as illustrated in FIG. 16, in operation 305, a first gate structure 150 is formed over the semiconductor substrate 101 and laterally between the first pixel 130 and the trench isolation 121 from the top view perspective. In operation 306, a second gate structure 160 is formed over second pixel 140 and adjacent to the first gate structure 150.

In some embodiments, a gate dielectric layer 171 is formed on the first side 101a over the semiconductor substrate 101. In some embodiments, a gate electrode layer is disposed over the gate dielectric layer 171 and patterned into the first gate electrode 151 and the second gate electrode 161. Each of the first gate electrode 151 and the second gate electrode 161 has an upper region 152 or 162 formed by implantation, in situ doping during deposition, or the like, and has the second conductivity type, such as n-type. In some embodiments, the first gate electrode 151 is formed between the connecting portion 131b of the first conductivity type region 131 and the isolation structure 121 from the top view perspective, and laterally away from the floating node 125 from the top view perspective. In some embodiments, the second gate electrode 161 is partially over the second pixel 140 and the floating node 125.

In some embodiments, the method 300 includes forming a dielectric layer 172 over the gate dielectric layer 171, wherein the dielectric layer 172 is attached to sidewalls 151s and 161s of the first gate electrode 151 and the second gate electrode 161, and attached to sidewalls 152s and 162s of the upper regions 152 and 162. In some embodiments, the dielectric layer 172 is conformally deposited over the gate dielectric layer 171. In some embodiments, the dielectric layer 172 is formed by suitable fabrication techniques such as spin coating, chemical vapor deposition (CVD), plasma-enhanced chemical vapor deposition (PECVD), or the like.

In some embodiments, the method 300 includes forming a resist protective layer (RPL) 173 conformally disposed over the dielectric layer 172. In some embodiments, the RPL 173 is formed by suitable fabrication techniques such as spin coating, chemical vapor deposition (CVD), plasma-enhanced chemical vapor deposition (PECVD), or the like. In some embodiments, the dielectric layer 172 and the RPL 173 can be etched to expose a top surface of the first gate structure 150 and/or the second gate structure 160.

In some embodiments, the method 300 includes forming an etch stop layer (ESL) 174 over the RPL 173. In some embodiments, the ESL 174 is conformally deposited over the RPL 173. In some embodiments, the ESL 174 is formed by suitable fabrication techniques such as spin coating, chemical vapor deposition (CVD), plasma-enhanced chemical vapor deposition (PECVD), or the like.

In some embodiments, the method 300 includes forming an inter-layer dielectric (ILD) 175 over the ESL 174, the first gate structure 150 and the second gate structure 160. In some embodiments, the ILD 175 is formed by suitable fabrication techniques such as spin coating, chemical vapor deposition (CVD), plasma-enhanced chemical vapor deposition (PECVD), or any acceptable deposition process. In some embodiments, the method 300 includes forming a contact 176 through the ILD 175. In some embodiments, an opening can be etched using acceptable photolithography techniques, and conductive materials, such as a copper, aluminum, or the like, with or without a barrier layer, may be deposited into the opening to form the contact 176 in the opening.

In some embodiments, the method 300 includes forming a doped layer 182 on the second side 101b of the semiconductor substrate 101. The doped layer 182 is formed by an ion implantation through the second side 101b of the semiconductor substrate 101. The doped layer 182 may be formed on the second side 101b of the semiconductor substrate 101 to increase a number of photons converted into electrons. In order to repair crystal defects that can be caused by ion implantation and to activate implanted ions, an annealing process such as a laser annealing process may be performed on the second side 101b of the semiconductor substrate 101.

In some embodiments, the method 300 includes forming a dielectric layer 183 over the doped layer 182. The dielectric layer 183 can be deposited by CVD, metalorganic chemical vapor deposition (MOCVD), ALD, the like, or a combination thereof. In some embodiments, the method 300 includes forming a color filter layer 184 over the dielectric layer 183. The color filter layer 184 may be formed by any suitable method.

In some embodiments, the method 300 includes forming a microlens layer 185 over the color filter layer 184. The microlens layer 185 includes material that may be patterned and formed into lenses. In some embodiments, the microlens layer 185 may be formed by deposition techniques like CVD, PVD, or the like, or by using a material in a liquid state deposited using spin-on techniques. This method has been found to produce a substantially planar surface and a microlens layer 185 having a substantially uniform thickness, thereby providing greater uniformity in the microlenses.

An aspect of this disclosure relates to a semiconductor structure. The semiconductor structure includes a semiconductor substrate having a first side; a trench isolation extending from the first side of the semiconductor substrate into the semiconductor substrate; a first pixel disposed in the semiconductor substrate and adjacent to the trench isolation; and a second pixel extending from the first side of the semiconductor substrate into the semiconductor substrate and disposed over the first pixel. The semiconductor structure further includes a first gate electrode disposed on the first side of the semiconductor substrate and electrically connected to the first pixel; and a second gate electrode disposed adjacent to the first gate electrode and electrically connected to the second pixel. Each of the first pixel and the second pixel includes a p-n junction, and the second pixel overlaps the first pixel from the top view perspective.

In some embodiments, an area of the first pixel is greater than an area of the second pixel. In some embodiments, the first pixel and the second pixel are surrounded by the trench isolation. In some embodiments, the first gate electrode and the second gate electrode are surrounded by the trench isolation from the top view perspective. In some embodiments, the first pixel includes a first conductivity type region and a second conductivity type region disposed under the first conductivity type region, wherein the first conductivity type region includes a main portion disposed under the second pixel and a connecting portion extending from the first side of the semiconductor substrate to the main portion. In some embodiments, the semiconductor substrate has a second side opposite to the first side, a color filter is disposed on the second side, and a micro-lens layer is disposed on the color filter. In some embodiments, a depth of the first pixel in the semiconductor substrate is greater than a depth of the second pixel in the semiconductor substrate.

An aspect of this description relates to an image sensor device. The image sensor device includes a semiconductor substrate having a first side; and a trench isolation structure extending from the first side of the semiconductor substrate into the semiconductor substrate and dividing the semiconductor substrate into a plurality of sensing units. Each sensing unit includes a first gate electrode disposed on the first side of the semiconductor substrate; and a second gate electrode separated from the first gate electrode. Each sensing unit further includes a first pixel and a second pixel extending from the first side of the semiconductor substrate into the semiconductor substrate and disposed between the first gate electrode and the second gate electrode from a top view perspective. The first pixel is disposed under the second pixel and is electrically connected to the first gate electrode, and the second pixel is electrically connected to the second gate electrode. Each sensing unit further includes a floating node disposed under the second gate electrode and laterally spaced apart from the first pixel and the second pixel.

In some embodiments, the floating node is shared by four sensing units. In some embodiments, the second gate electrode overlaps the first pixel from the top view perspective. In some embodiments, the floating node includes a source/drain region and an extension region extending from the source/drain region toward the second pixel, wherein the second gate electrode is partially over the extension region. In some embodiments, a ratio of an area of the first pixel to an area of the second pixel is between about 49:32 and about 80:1. In some embodiments, a depth of the first pixel is between 1 and 10 μm, and a depth of the second pixel is less than the thickness of the first pixel. In some embodiments, a distance between a center of the first pixel and a center of the second pixel is between 0.1 and 9 μm. In some embodiments, the second pixel overlaps the first pixel from the top view perspective.

An aspect of this description relates to a method of manufacturing a semiconductor structure. The method includes forming a recess in a semiconductor substrate; disposing a dielectric material into the recess to form a trench isolation; and forming a first pixel in the semiconductor substrate proximate to the trench isolation. The method further includes forming a second pixel in the semiconductor substrate over the first pixel; forming a first gate structure over the semiconductor substrate and laterally between the first pixel and the trench isolation from a top view perspective; and forming a second gate structure over the second pixel and adjacent to the first gate structure.

In some embodiments, the formation of the first pixel includes forming a first conductivity type region in the semiconductor substrate, forming a main portion of a second conductivity type region over the first conductivity type region, and forming a connecting portion of the second conductivity type region over the main portion of the second conductivity type region, wherein the connecting portion is disposed adjacent to the second pixel and exposed through a first side of the semiconductor substrate. In some embodiments, the formation of the second pixel includes forming a diffusion region of the second pixel in the semiconductor substrate and over the main portion of the second conductivity type region of the first pixel, forming a first conductivity type region over the diffusion region of the second pixel, and forming a second conductivity type region of the second pixel over a portion of the first conductivity type region of the second pixel. In some embodiments, the connecting portion of the second conductivity type region of the first pixel and the diffusion region of the second pixel overlap the main portion of the second conductivity type region of the first pixel from the top view perspective. In some embodiments, the method further includes forming a floating node in the semiconductor substrate and laterally spaced apart from the first pixel and the second pixel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out same purposes and/or achieving same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a semiconductor substrate having a first side;
a trench isolation extending from the first side of the semiconductor substrate into the semiconductor substrate;
a first pixel disposed in the semiconductor substrate and adjacent to the trench isolation;
a second pixel extending from the first side of the semiconductor substrate into the semiconductor substrate and disposed over the first pixel;
a first gate electrode disposed on the first side of the semiconductor substrate and electrically connected to the first pixel; and
a second gate electrode disposed adjacent to the first gate electrode and electrically connected to the second pixel,
wherein each of the first pixel and the second pixel includes a p-n junction, the first pixel includes a first conductivity type region having an L-shape from a cross-sectional view, and the second pixel overlaps the first pixel from a top view perspective.

2. The semiconductor structure of claim 1, wherein an area of the first pixel is greater than an area of the second pixel.

3. The semiconductor structure of claim 1, wherein the first pixel and the second pixel are surrounded by the trench isolation.

4. The semiconductor structure of claim 1, wherein the first gate electrode and the second gate electrode are surrounded by the trench isolation from the top view perspective.

5. The semiconductor structure of claim 1, wherein the first pixel includes the first conductivity type region and a second conductivity type region disposed under the first conductivity type region, wherein the first conductivity type region includes a main portion disposed under the second pixel and a connecting portion extending from the first side of the semiconductor substrate to the main portion.

6. The semiconductor structure of claim 1, wherein the semiconductor substrate has a second side opposite to the first side, a color filter is disposed on the second side, and a micro-lens layer is disposed on the color filter.

7. The semiconductor structure of claim 1, wherein a depth of the first pixel in the semiconductor substrate is greater than a depth of the second pixel in the semiconductor substrate.

8. An image sensor device, comprising:
a semiconductor substrate having a first side; and
a trench isolation structure extending from the first side of the semiconductor substrate into the semiconductor substrate and dividing the semiconductor substrate into a plurality of sensing units, wherein each sensing unit includes:
a first gate electrode disposed on the first side of the semiconductor substrate;
a second gate electrode separated from the first gate electrode;
a first pixel and a second pixel extending from the first side of the semiconductor substrate into the semiconductor substrate and disposed between the first gate electrode and the second gate electrode from a top view perspective, wherein the first pixel is disposed under the second pixel and electrically connected to the first gate electrode, the second pixel is electrically connected to the second gate electrode, and an area of the first pixel is greater than an area of the second pixel; and
a floating node disposed under the second gate electrode and laterally spaced apart from the first pixel and the second pixel,
wherein the first pixel includes a main portion disposed under the second pixel and a connecting portion extending from the first side of the semiconductor substrate to the main portion and electrically connected to the first gate electrode, the connecting portion of the first pixel and the entire second pixel overlap the main portion of the first pixel from the top view perspective.

9. The image sensor device of claim 8, wherein the floating node is shared by four sensing units.

10. The image sensor device of claim 8, wherein the second gate electrode overlaps the first pixel from the top view perspective.

11. The image sensor device of claim 8, wherein the floating node includes a source/drain region and an extension region extending from the source/drain region toward the second pixel, and the second gate electrode is partially over the extension region.

12. The image sensor device of claim 8, wherein a ratio of an area of the first pixel to an area of the second pixel is between about 49:32 and about 80:1.

13. The image sensor device of claim 8, wherein a depth of the first pixel is between 1 and 10 μm, and a depth of the second pixel is less than a depth of the first pixel.

14. The image sensor device of claim 8, wherein a distance between a center of the first pixel and a center of the second pixel is between 0.1 and 9 μm.

15. The image sensor device of claim 8, wherein the connecting portion of the first pixel is disposed adjacent to the second pixel, and the second pixel overlaps the maim portion of the first pixel from the top view perspective.

16. An image sensor device, comprising:
a semiconductor substrate having a first side; and
a trench isolation structure extending from the first side of the semiconductor substrate into the semiconductor substrate;
a first gate electrode disposed on the first side of the semiconductor substrate;
a second gate electrode separated from the first gate electrode; and
a first pixel and a second pixel extending from the first side of the semiconductor substrate into the semiconductor substrate and disposed between the first gate electrode and the second gate electrode from a top view perspective, wherein the first pixel is disposed under the second pixel and electrically connected to the first gate electrode, and the second pixel is electrically connected to the second gate electrode,
wherein the first pixel includes a first conductivity type region and a second conductivity type region disposed under the first conductivity type region, wherein the first conductivity type region includes a main portion disposed under the second pixel and a connecting portion adjacent to the second pixel and extending from the first side of the semiconductor substrate to the main portion.

17. The image sensor device of claim 16, wherein a depth of the second pixel is similar to a depth of the connecting portion of the first conductivity type region.

18. The image sensor device of claim 16, further comprising:
a floating node disposed under the second gate electrode between the first pixel and the trench isolation structure,
wherein the second pixel is disposed between the floating node and the connecting portion of the first pixel.

19. The image sensor device of claim 16, wherein the first conductivity type region has an L-shape from a cross-sectional view.

20. The image sensor device of claim 16, wherein a depth of the main portion is greater than a depth of the connecting portion.

* * * * *